United States Patent
Shin et al.

(10) Patent No.: US 10,068,525 B2
(45) Date of Patent: Sep. 4, 2018

(54) DISPLAY DEVICE

(71) Applicant: SAMSUNG DISPLAY CO., LTD., Yongin-si, Gyeonggi-do (KR)

(72) Inventors: Hyun Eok Shin, Gwacheon-si (KR); Joon Yong Park, Gunpo-si (KR); Chan Woo Yang, Siheung-si (KR); Dong Min Lee, Anyang-si (KR); Ju Hyun Lee, Seongnam-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/595,119

(22) Filed: May 15, 2017

(65) Prior Publication Data

US 2017/0358764 A1 Dec. 14, 2017

(30) Foreign Application Priority Data

Jun. 13, 2016 (KR) .................. 10-2016-0073175

(51) Int. Cl.
*H01L 51/05* (2006.01)
*G09G 3/3233* (2016.01)
*H01L 51/52* (2006.01)

(52) U.S. Cl.
CPC ....... *G09G 3/3233* (2013.01); *H01L 51/5203* (2013.01); *H01L 51/5271* (2013.01)

(58) Field of Classification Search
None
See application file for complete search history.

(56) References Cited

U.S. PATENT DOCUMENTS

| | | | |
|---|---|---|---|
| 7,307,380 B2 | 12/2007 | Yeh et al. | |
| 2002/0185969 A1* | 12/2002 | Raychaudhuri | H01L 51/5092 313/506 |
| 2004/0140758 A1* | 7/2004 | Raychaudhuri | H01L 51/5088 313/504 |
| 2007/0007515 A1* | 1/2007 | Suh | H01L 27/3246 257/40 |
| 2007/0162074 A1* | 7/2007 | Bartlett | A61B 17/0401 606/232 |
| 2015/0137103 A1 | 5/2015 | Hosono et al. | |
| 2016/0149161 A1* | 5/2016 | Lee | H01L 51/5271 257/40 |
| 2017/0084635 A1* | 3/2017 | Jung | H01L 27/1218 |

FOREIGN PATENT DOCUMENTS

| | | |
|---|---|---|
| JP | 2016-35888 A | 3/2016 |
| KR | 10-2006-0111643 A | 10/2006 |

* cited by examiner

*Primary Examiner* — Ashok Patel
(74) *Attorney, Agent, or Firm* — Lee & Morse, P.C.

(57) ABSTRACT

A display device includes a reflective layer on a first electrode, the reflective layer including silver or a silver alloy, an inorganic layer on the reflective layer, the inorganic layer having a work function that is lower than that of the reflective layer, an emission layer on the inorganic layer, an organic layer on the emission layer, and a second electrode on the organic layer.

14 Claims, 6 Drawing Sheets

DISPLAY DEVICE

CROSS-REFERENCE TO RELATED APPLICATION

Korean Patent Application No. 10-2016-0073175, filed on Jun. 13, 2016, in the Korean Intellectual Property Office, and entitled: "Display Device," is incorporated by reference herein in its entirety.

BACKGROUND

1. Field

Embodiments relate to a display device.

2. Description of the Related Art

An organic light emitting display device may include two electrodes and an emission portion between the two electrodes. An electron injected from one electrode and a hole injected from the other electrode may be coupled with each other in the emission portion to generate an exciton, and the exciton may emit energy in the form of light.

The above information disclosed in this Background section is only for enhancement of understanding of the background of the described technology and therefore it may contain information that does not form the prior art that is already known in this country to a person of ordinary skill in the art.

SUMMARY

Embodiments are directed to a display device, including a reflective layer on a first electrode, the reflective layer including silver or a silver alloy, an inorganic layer on the reflective layer, the inorganic layer having a work function that is lower than that of the reflective layer, an emission layer on the inorganic layer, an organic layer on the emission layer, and a second electrode on the organic layer.

The inorganic layer may include a first inorganic layer and a second inorganic layer, the first inorganic layer may include a material having a work function that is lower than that of the reflective layer, and the second inorganic layer may have a work function that is lower than that of the first inorganic layer.

The first inorganic layer may include a material having a work function that is less than 4.0 eV, and the second inorganic layer may include a material that is less than 3.2 eV.

The first inorganic layer may include a material having a work function that is less than 3.5 eV.

The first inorganic layer may include a material having transmittance of 90% or more in a wavelength of 380 nm to 780 nm.

The first inorganic layer may include at least one selected from Zn, Sc, an alloy thereof, or a combination thereof.

The second inorganic layer may include at least one selected from $12CaO.7Al_2O_3$, Ba, Ca, Nb, an oxide thereof, or a combination thereof.

The first electrode may include at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The display device may further include a transparent electrode layer between the reflective layer and the inorganic layer. The inorganic layer may include a material having a work function of 3.2 eV or less.

The transparent electrode layer may include at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

According to the example embodiment, the driving voltage can be reduced and at the same time light emission efficiency can be improved, and therefore a life-span characteristic of the display device can be enhanced.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In addition, unless explicitly described to the contrary, the word "comprise" and variations such as "comprises" or "comprising" will be understood to imply the inclusion of stated elements but not the exclusion of any other elements.

Figure 1:
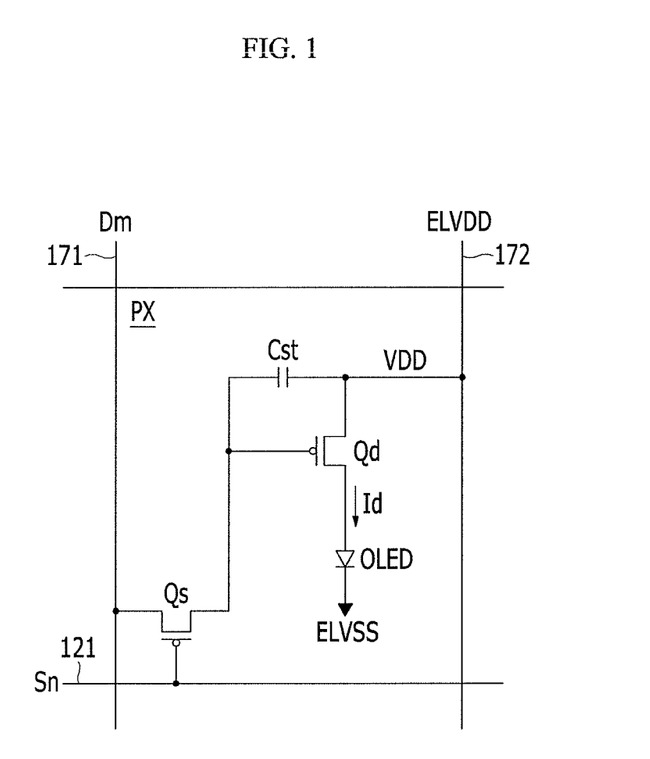
FIG. 1 illustrates an equivalent circuit of a display device according to an example embodiment.

FIG. 1 illustrates an equivalent circuit diagram of a display device according to an example embodiment.

As shown in FIG. 1, a single pixel PX of a display device according to an example embodiment may include a plurality of signal lines 121, 171, and 172, transistors Qd and Qs that are connected to the plurality of signal lines 121, 171, and 172, a storage capacitor Cst, and an organic light emitting diode (OLED).

The plurality of signal lines 121, 171, and 172 may include a scan line 121 that transmits a scan signal Sn, a data line 171 that transmits a data signal Dm, and a driving voltage line 172 that transmits a driving voltage ELVDD.

The transistors Qd and Qs may include a driving transistor Qd and a switching transistor Qs.

The switching transistor Qs may include a control terminal, an input terminal, and an output terminal, and the control terminal may be connected to the scan line 121, the input terminal may be connected to the data line 171, and the output terminal may be connected to the driving transistor Qd. The switching transistor Qs may transmit the data signal Dm that is applied to the data line 171 in response to the scan signal Sn applied to the scan line 121.

The driving transistor Qd may include a control terminal, an input terminal, and an output terminal, and the control terminal may be connected to the switching transistor Qs, the input terminal may be connected to the driving voltage line 172, and the output terminal may be connected to the organic light emitting diode OLED. The driving transistor Qd may output a driving current Id, the magnitude of which varies according to a voltage applied between the control terminal and the output terminal.

The storage capacitor Cst may be connected between the control terminal and the input terminal of the driving transistor Qd. In this case, the storage capacitor Cst may charge a data signal applied to the control terminal of the driving transistor Qd, and maintain the charge of the data signal after the switching transistor Qs is turned off.

The organic light emitting diode OLED may include an anode connected to the output terminal of the driving transistor Qd and a cathode connected to a common voltage VSS. The organic light emitting diode OLED may display an image by emitting light, the strength of which varies depending on a driving current Id of the driving transistor Qd.

The switching transistor Qs and the driving transistor Qd may be n-channel field effect transistors (FET) or p-channel field effect transistors. A connection relationship between the switching and driving transistors Qs and Qd, the storage capacitor Cst, and the organic light emitting diode OLED may be varied.

Figure 2:
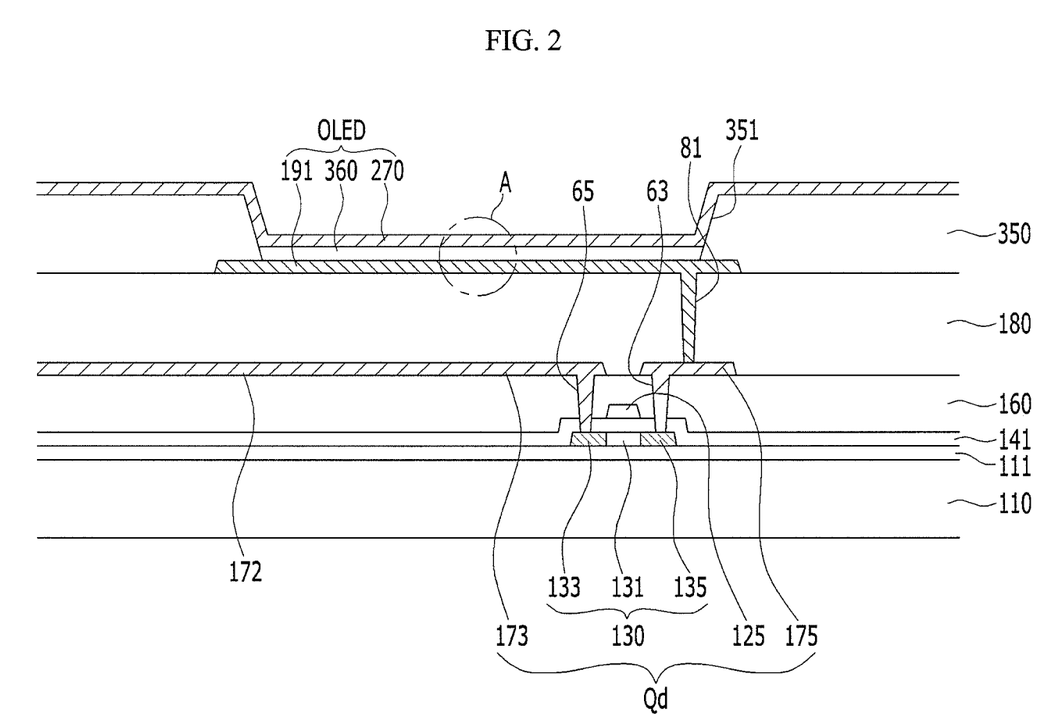
FIG. 2 illustrates a partial cross-sectional view of the display device according to the example embodiment.
Figure 3:
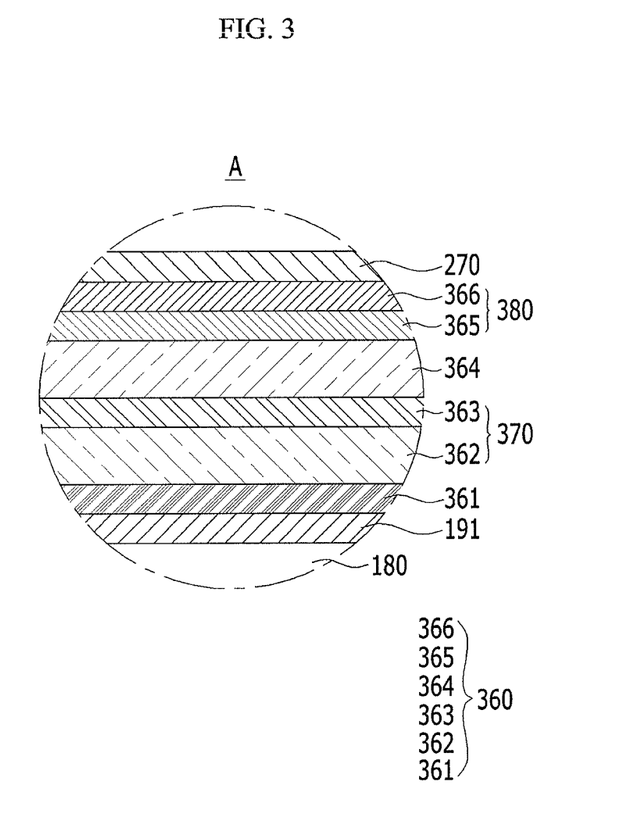
FIG. 3 illustrates an enlarged view of the portion A of FIG. 2.

FIG. 2 illustrates a cross-section of a portion of the display device of FIG. 1, in which the driving transistor Qd is included, and FIG. 3 is a partial enlarged view of the portion A of FIG. 2. The switching transistor Qs and the driving transistor Qd may have similar interlayer configurations.

A structure of the display device according to an example embodiment will now be described in detail.

Referring to FIG. 2, the display device according to the present example embodiment includes a plurality of thin film structures that are disposed on a substrate 110.

The substrate 110 may be, for example, an insulating material made of glass, quartz, ceramic, plastic, etc.

A buffer layer 111, which may help prevent permeation of an impurity element and planarize the surface, may be provided on the substrate 110. The buffer layer 111 may include, for example, an inorganic insulating material such as a silicon oxide (SiOx), a silicon nitride (SiNx), aluminum oxide ($Al_2O_3$), hafnium oxide ($HfO_3$), and yttrium oxide ($Y_2O_3$). The buffer layer 111 may be, for example, a single layer or a multilayer.

A driving semiconductor layer 130 may be provided on the buffer layer 111. The driving semiconductor layer 130 may include, for example, an oxide semiconductor material. The oxide semiconductor material may include, for example, a metal oxide of zinc (Zn), indium (In), gallium (Ga), tin (Sn), or titanium (Ti), or a combination of metals of zinc (Zn), indium (In), gallium (Ga), tin (Sn), titanium (Ti), or oxides thereof. For example, the oxide may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

In the present example embodiment, the driving semiconductor layer 130 includes a channel 131, a source region 133, and a drain region 135, and the source region 133 and the drain region 135 are respectively disposed at opposite sides of the channel 131.

A first insulation layer 141 that covers the driving semiconductor layer 130 may be provided on the driving semiconductor layer 130. The first insulation layer 141 may include, for example, an insulating material such as a silicon oxide ($SiO_x$), a silicon nitride ($SiN_x$), a silicon oxynitride ($SiO_xN_y$), aluminum oxide ($Al_2O_3$), hafnium oxide ($HfO_3$), yttrium oxide ($Y_2O_3$), etc.

A gate electrode 125 may be provided on the first insulation layer 141. The gate electrode 125 may be a multilayer where a metal layer that includes one of copper (Cu), a copper alloy, aluminum (Al), and an aluminum alloy, and a metal layer that includes one of molybdenum (Mo) and a molybdenum alloy, are stacked.

A second insulating layer 160 may be provided on the gate electrode 125. The second insulation layer 160 may serve as an interlayer insulating layer. The second insulation layer 160 may cover the gate electrode 125. The second insulation layer 160 may include, for example, an insulating material such as a silicon oxide ($SiO_x$), a silicon nitride ($SiN_x$), a silicon oxynitride ($SiO_xN_y$), aluminum oxide ($Al_2O_3$), hafnium oxide ($HfO_3$), yttrium oxide ($Y_2O_3$), etc.

The second insulation layer 160 may have a first contact hole 63 and a second contact hole 65 that respectively overlap the source region 133 and the drain region 135.

A source electrode 173 and a drain electrode 175 may be provided on the second insulation layer 160. The source electrode 173 may be connected with the source region 133 through the first contact hole 63, and the drain electrode 175 may be connected with the drain region 135 through the second contact hole 65.

The driving semiconductor layer 130, the gate electrode 125, the source electrode 173, and the drain electrode 175 may form the driving transistor Qd.

A passivation layer 180 may be provided on the source electrode 173 and the drain electrode 175. The passivation layer 180 may have pixel contact hole 81 that overlaps the drain electrode 175. The passivation layer 180 may be provided as a stacked layer of, for example, an organic material such as a polyacrylic resin, a polyimide resin, or the like, or a stacked layer of an organic material and an inorganic material.

A first electrode 191 may be provided on the passivation layer 180, and the first electrode 191 may be made of, for example, a transparent conductive material. The transparent conductive material may be or include, for example, at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), aluminum-doped zinc oxide (AZO), etc.

The first electrode 191 may be electrically connected to the drain electrode 175 of the driving transistor Qd through the pixel contact hole 81 formed in the passivation layer 180 and may serve as a cathode of the organic light emitting diode OLED.

A pixel defining layer 350 may be provided on the passivation layer 180 and an edge of the first electrode 191. The pixel defining layer 350 may have a pixel opening 351 that overlaps the first electrode 191. The pixel defining layer 350 may include, for example, a polyacrylate-based resin or a polyimide-based resin, and a silica-based inorganic material.

An emission portion 360 may be provided in the pixel opening 351 of the pixel defining layer 350, and a second electrode 270 may be provided on the pixel defining layer 350 and the emission portion 360.

The second electrode 270 may be, for example, e a transflective electrode that includes a transflective material. The term, "transflective" implies that reflectance with respect to incident light is about 0.1% or more and about 70% or less, or about 30% or more and about 50% or less. The transflective material may be or include, for example, silver (Ag), magnesium (Mg), aluminum (Al), chromium (Cr), molybdenum (Mo), tungsten (W), titanium (Ti), gold (Au), palladium (Pd), an alloy thereof, etc. The second electrode 270 may serve as an anode of the organic light emitting diode OLED. The first electrode 191, the emission portion 360, and the second electrode 270 may form the organic light emitting diode OLED.

In the present example embodiment, an inverted structure is formed such that the first electrode 191 functions as a cathode, the second electrode 270 functions as an anode, and the first electrode 191 is connected to the drain electrode 175 of the driving transistor Qd.

Hereinafter, the emission portion 360 between the first electrode 191, which is a cathode, and the second electrode 270, which is an anode, will be described in detail with reference to FIG. 3.

In the display device according to the present example embodiment, the emission portion 360 may include a reflective layer 361, an inorganic layer 370, an emission layer 364, and an organic layer 380. As described in further detail below, the inorganic layer 370 may include a first inorganic layer 362 as an electron transfer layer and a second inorganic layer 363 as an electron injection layer.

The reflective layer 361 may be provided on the first electrode 191, and may include, for example, silver (Ag) or a silver alloy.

The reflective layer 361 having high reflectance may be provided between the first electrode 191 and the emission layer 364. Thus, light emitted from the emission portion 360 that is provided on the reflective layer 361 may be reflected in a constant direction so that light emission efficiency of the display device according to the present example embodiment may be improved. Here, the reflective layer 361 may imply a layer of which reflectance is greater than about 70% and less than about 100%, or greater than about 80% and less than about 100%.

Figure 4:
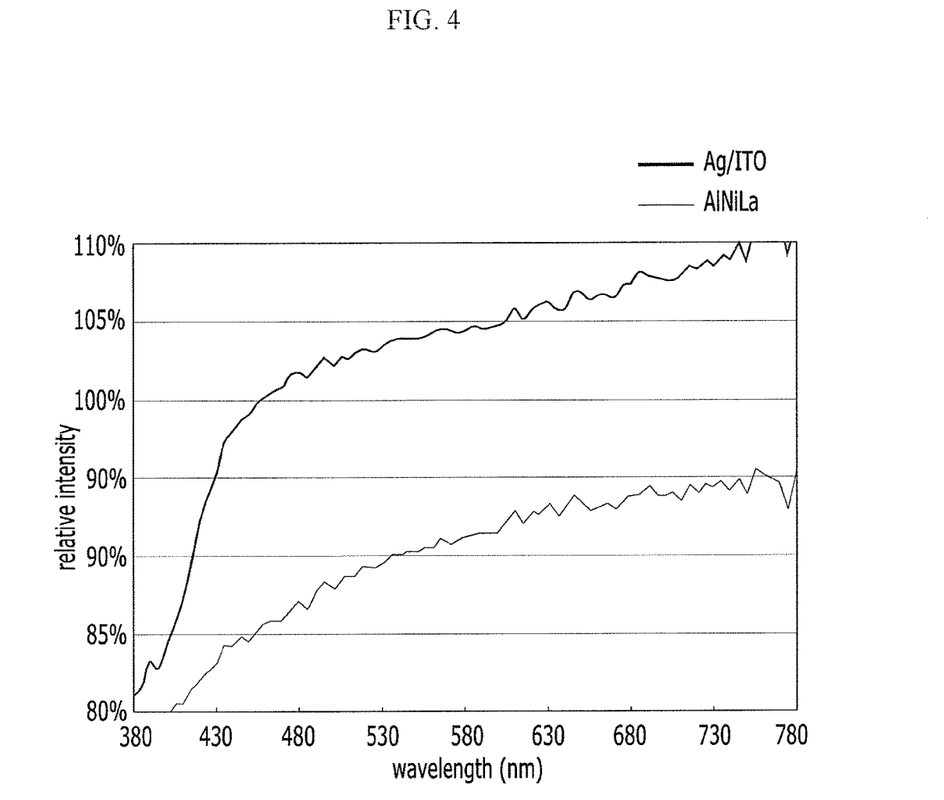
FIG. 4 illustrates reflectance of an electrode plate.

In FIG. 4, relative reflectance of an electrode plate that is made of a material (AlNiLa) that includes aluminum and an electrode plate that is made of silver (Ag/ITO) is shown with reference to an aluminum plate having a thickness of 1000 Å.

As shown in FIG. 4, when silver or a silver alloy having relatively high reflectance is used as the reflective layer 361 rather than including aluminum, light emission efficiency of the display device according to an example embodiment may be significantly improved.

The inorganic layer 370 may be provided on the reflective layer 361. The inorganic layer 370 may include a material having a work function that is lower than that of the reflective layer 361. For example, a work function of silver (Ag) or a silver (Ag) alloy is about 4.6 eV to 5.0 eV in general, and therefore the work function of the inorganic layer 370 may be lower than the work function of silver or the silver alloy. When the inorganic layer 370 formed by using a material having a work function that is lower than that of the reflective layer 361 is provided on the reflective layer 361, an entrance barrier during interlayer transfer of electrons may be lowered such that the light emission efficiency of the display device can be more improved.

The inorganic layer 370 may include the first inorganic layer 362 and the second inorganic layer 363, and the first inorganic layer 362 may be an electron transfer layer and the second inorganic layer 363 may be an electron injection layer. The first inorganic layer 362 may include a material having a work function that is lower than that of the reflective layer 361. For example, the first inorganic layer 362 may include a material having a work function of 4.0 eV or less or 3.5 eV or less. As the material included in the first inorganic layer 362, for example, one or more of Zn, Sc, an oxide thereof, or a combination thereof, may be selected.

The first inorganic layer 362 may include a material having transmittance of 90% or more or between 90% and 99.9% in a wavelength of 380 nm to 780 nm. When the material included in the first inorganic layer 362 has transmittance that satisfies the above-described range, light reflected from the reflective layer 316 may be effectively transmitted such that light emission efficiency of the display device can be improved.

The first inorganic layer 362 may have a thickness of, for example, about 2000 Å to about 3000 Å. When the thickness of the first inorganic layer 362 satisfies such a range, electron transport may be smoothly performed.

The second inorganic layer 363 may include a material having a work function that is lower than that of the first inorganic layer 362. For example, the second inorganic layer 363 may include a material having a work function of 3.2 eV or less. As the material included in the second inorganic layer 363, for example, at least one of $12CaO.7Al_2O_3$, Ba, Ca, Nb, an oxide thereof, or a combination thereof, may be selected.

The second inorganic layer 363 may have a thickness of, for example, about 50 Å to about 500 Å. When the thickness of the second inorganic layer 363 satisfies such a range, electron injection may be smoothly performed.

The material included in the second inorganic layer 363 may have a work function that is lower than that of the material included in the first inorganic layer 362, and the material included in the first inorganic layer 362 may have a work function that is lower than that of the reflective layer 361. Thus, interlayer movement during transport and injection of electrons may be smoothly performed, and accordingly, light emission efficiency of the display device may be improved.

Figure 5:
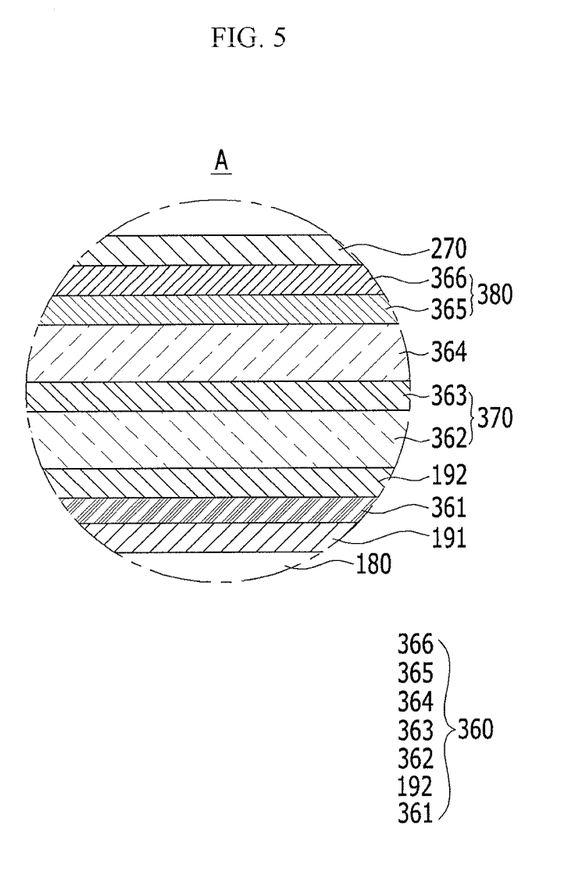
FIG. 5 and FIG. 6 respectively illustrate various examples of a structure of the portion A of FIG. 2.
Figure 6:
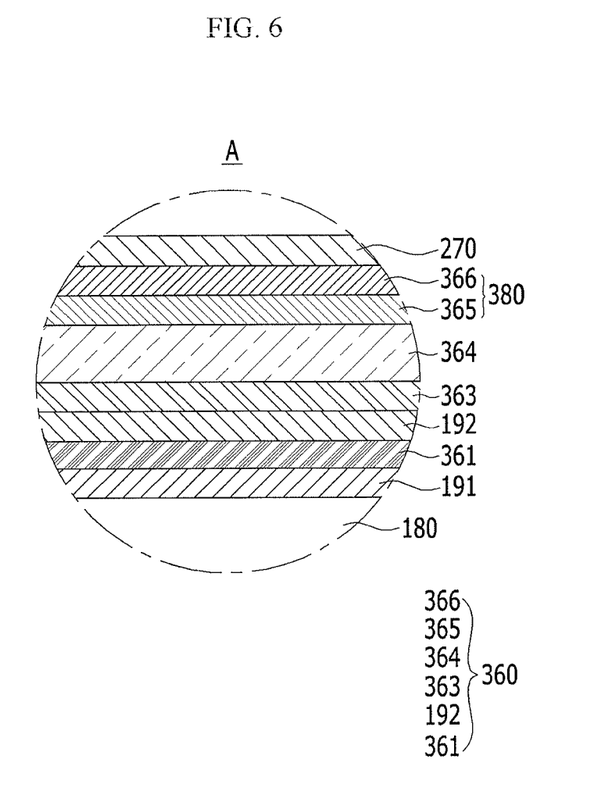

FIG. 5 and FIG. 6 show examples of stacked structures of the reflective layer 361 and the inorganic layer 370.

Referring to FIG. 5, the emission portion 360 may include a transparent electrode layer 192 between the reflective layer 361 and the inorganic layer 370. The inorganic layer 370 may include the above-described first and second inorganic layers 362 and 363.

The transparent electrode layer 192 may include, for example, at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO). The transparent electrode layer 192 may be formed by using the same material as that of the above-described first electrode 191 or may be formed by using another material.

The structure of the emission portion 360 shown in FIG. 5 is the same as in the above-described structure, except that the transparent electrode layer 192 is included.

Referring to FIG. 6, the emission portion 360 includes the transparent electrode layer 192 between the reflective layer 361 and the inorganic layer, but the inorganic layer may be an inorganic layer including a material that has a work function of 3.2 eV or less, rather than having a stacked structure of inorganic layers 362 and 363. Thus, the inorganic layer may have a single-layered structure of the second inorganic layer 363. The first inorganic layer 363, which may be relatively thick, may be omitted, and accordingly, the thickness of the emission portion 360 may be reduced.

In the structure of the emission portion 360 shown in FIG. 6, the inorganic layer 370 may be the same as the above-described inorganic layer, except that the inorganic layer 370 is formed as a single layer of the second inorganic layer 363.

In the display device according to an example embodiment, the first electrode 191, the reflective layer 361, and the inorganic layer 370 are made of an inorganic material, and accordingly they may be formed through one continuous process. Further, the inorganic layer 370 that provides electron transport and/or electron injection functions may be formed by using an inorganic material that is relatively inexpensive compared to an organic material, such that manufacturing cost of the display device may be significantly reduced.

The emission layer 364 may be provided on the inorganic layer 370.

The emission layer 364 may include a light emission material that displays a specific color. For example, the emission layer 364 may display a basic color such as blue, green, or red, or a combination thereof.

The thickness of the emission layer 364 may be, for example, about 10 nm to about 50 nm. The emission layer 364 may include a host and a dopant. The emission layer 364 may include a material that emits red light, green light, blue light, and white light, and may be formed using a phosphorescent or fluorescent material.

When the emission layer 364 emits the red light, the emission layer 364 may include a host material that includes CBP (carbazole biphenyl) or mCP (1,3-bis(carbazol-9-yl)), and may be formed of a phosphorescent material including, for example, at least one selected from a group of PIQIr (acac) (bis(1-phenylisoquinoline)acetylacetonate iridium), PQIr(acac) (bis(1-phenylquinoline)acetylacetonate iridium), PQIr (tris(1-phenylquinoline)iridium), and PtOEP (octaethylporphyrin platinum), a fluorescent material including PBD:Eu(DBM)3(Phen) or perylene, etc.

When the emission layer 364 emits the green light, the emission layer 364 may include a host material including, for example, CBP or mCP, and may be made of a phosphorescent material including a dopant material including $Ir(ppy)_3$ (fac-tris(2-phenylpyridine)iridium) or a fluorescent material including $Alq_3$ (tris(8-hydroxyquinolino)aluminum), etc.

When the emission layer 364 emits the blue light, the emission layer 364 may include a host material including, for example, CBP or mCP, and may be made of a phosphorescent material including a dopant that includes (4,6-$F2ppy)_2Irpic$. In another implementation, the emission layer 364 may be made of a fluorescent material including, for example, at least one selected from a group of spiro-DPVBi, spiro-6P, distyrylbenzene (DSB), distyrylarylene (DSA), a PFO-based polymer, or a PPV-based polymer, etc.

The organic layer 380 may be provided on the emission layer 364.

The organic layer 380 may include, for example, a first organic layer 365 and a second organic layer 366, and the first organic layer 365 may be a hole transport layer and the second organic layer 366 may be a hole injection layer.

The first organic layer 365 may include, for example, N,N-dinaphthyl-N,N'-diphenyl benzidine (NPD), N,N'-bis-(3-methylphenyl)-N,N'-bis-(phenyl)-benzidine (TPD), s-TAD, 4,4',4"-tris-(N-3-methylphenyl-N-phenyl-amino)-triphenylamine (MTDATA), etc.

The second organic layer 366 may include, for example, 4,4',4"-tris-(3-methylphenylphenylamino)triphenylamine (MTDATA), copper phthalocyanine (CuPc), poly(3,4-ethylenedioxythiophene, polystyrene sulfonate (PEDOT/PSS), etc.

In the present example embodiment, the organic layer 380 has a stacked structure of the first organic layer 365 and the second organic layer 366, but the hole transport/injection layer may be provided as a single layer by forming the first organic layer 365 and including a hole injection material in the first organic layer 365.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

Example 1 is a display device having a structure in which a reflective layer made of Ag, an electron transport layer made of bis(benzoquinoline)beryllium ($BeBq_2$), an electron injection layer made of LiF, an emission layer including CBP, a hole transport layer made of NPB, and a hole injection layer made of CuPc are sequentially stacked on a cathode made of ITO, and an anode that includes silver (Ag) and magnesium (Mg) is formed thereon.

COMPARATIVE EXAMPLE 1

Comparative Example 1 is a display device that has the same structure as the display device of Example 1, except that a reflective layer made of Al is formed instead of forming a reflective layer made of Ag.

EXPERIMENTAL EXAMPLE

Driving voltages and light emission efficiency of RGB with respect to the display devices of Example 1 and Comparative Example 1 were measured. The measurement results are shown in Table 1.

TABLE 1

| Example | Driving voltage (V) | | | Light emission efficiency (cd/A) | | |
| --- | --- | --- | --- | --- | --- | --- |
| | R | G | B | R | G | B |
| Example 1 | 3.9 | 3.7 | 4.3 | 37.9 | 42.4 | 73.1 |
| Comparative Example 1 | 4.3 | 4.5 | 4.9 | 31.7 | 40.0 | 78.8 |

Referring to Table 1, in the case of the display device of Example 1, which includes the reflective layer that is made of silver (Ag), RGB driving voltages were reduced by about 0.4 to 0.8 V compared to Comparative Example 1. In addition, referring to the RGB light emission efficiency results, light emission efficiency of R and G of the display device according to Example 1 was increased by about 15% and 5%, respectively, compared to Comparative Example 1.

By way of summation and review, to reduce power consumption of an organic light emitting display device, light emission efficiency of the organic light emitting display device may be improved. In general, the light emission efficiency may be proportional to the number of excitons generated from the emission portion. Thus, efficiency in injection of electrons and holes from the electrodes to the emission portion may improve exciton generation and light emission efficiency.

As described above, embodiments may provide a display device having improved light emission efficiency with reduced driving voltage. Embodiments may provide a display device having an excellent life-span characteristic.

DESCRIPTION OF SYMBOLS

191: first electrode
360: emission portion
361: reflective layer
362: first inorganic layer
363: second inorganic layer
364: emission layer
365: first organic layer
366: second organic layer
270: second electrode Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate;
a cathode on the substrate;
a reflective layer on the cathode, the reflective layer including silver or a silver alloy;
an inorganic layer on the reflective layer, the inorganic layer having a work function that is lower than that of the reflective layer, the reflective layer being between the cathode and the inorganic layer;
an emission layer on the inorganic layer;
an organic layer on the emission layer; and
an anode on the organic layer.

2. The display device as claimed in claim 1, wherein the inorganic layer includes a first inorganic layer and a second inorganic layer, the first inorganic layer includes a material having a work function that is lower than that of the reflective layer, and the second inorganic layer has a work function that is lower than that of the first inorganic layer.

3. The display device as claimed in claim 2, wherein the first inorganic layer includes a material having a work function that is less than 4.0 eV, and the second inorganic layer includes a material that is less than 3.2 eV.

4. The display device as claimed in claim 3, wherein the first inorganic layer includes a material having a work function that is less than 3.5 eV.

5. The display device as claimed in claim 2, wherein the first inorganic layer includes a material having transmittance of 90% or more in a wavelength of 380 nm to 780 mm.

6. The display device as claimed in claim 2, wherein the first inorganic layer includes at least one selected from Zn, Sc, an alloy thereof, or a combination thereof.

7. The display device as claimed in claim 2, wherein the second inorganic layer includes at least one selected from $12CaO.7Al_2O_3$, Ba, Ca, Nb, an oxide thereof, or a combination thereof.

8. The display device as claimed in claim 1, wherein the cathode includes at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

9. The display device as claimed in claim 1, further comprising a transparent electrode layer between the reflective layer and the inorganic layer.

10. The display device as claimed in claim 9, wherein the inorganic layer includes a material having a work function of 3.2 eV or less.

11. The display device as claimed in claim 9, wherein the transparent electrode layer includes at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

12. A display device, comprising:
a reflective layer on a first electrode, the reflective layer including silver or a silver alloy;
an inorganic layer on the reflective layer, the inorganic layer having a work function that is lower than that of the reflective layer;
a transparent electrode layer between the reflective layer and the inorganic layer;
an emission layer on the inorganic layer;
an organic layer on the emission layer; and
a second electrode on the organic layer.

13. The display device as claimed in claim 12, wherein the inorganic layer includes a material having a work function of 3.2 eV or less.

14. The display device as claimed in claim 12, wherein the transparent electrode layer includes at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

* * * * *